(12) United States Patent
Dubey

(10) Patent No.: US 11,581,888 B1
(45) Date of Patent: Feb. 14, 2023

(54) POWER-ON RESET CIRCUIT WITH REDUCED DETECTION TIME

(71) Applicant: XILINX, INC., San Jose, CA (US)

(72) Inventor: Hari Bilash Dubey, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/555,192

(22) Filed: Dec. 17, 2021

(51) Int. Cl.
*H03K 17/22* (2006.01)

(52) U.S. Cl.
CPC ................................ *H03K 17/223* (2013.01)

(58) Field of Classification Search
None
See application file for complete search history.

(56) References Cited

U.S. PATENT DOCUMENTS

| | | |
|---|---|---|
| 4,746,822 A | 5/1988 | Mahoney |
| 5,394,104 A | 2/1995 | Lee |
| 5,495,196 A | 2/1996 | Rothman |
| 5,689,516 A | 11/1997 | Mack et al. |
| 5,831,460 A | 11/1998 | Zhou |
| 6,005,423 A | 12/1999 | Schultz |
| 6,160,431 A | 12/2000 | Crotty |
| 6,362,669 B1 | 3/2002 | Zhou et al. |
| 6,683,481 B1 | 1/2004 | Zhou et al. |
| 6,792,527 B1 | 9/2004 | Allegrucci |
| 6,847,240 B1 | 1/2005 | Zhou |
| 7,161,396 B1 | 1/2007 | Zhou et al. |
| 7,403,051 B1 | 7/2008 | Lesea |
| 7,667,489 B1 | 2/2010 | Vasudevan |
| 8,823,418 B2 * | 9/2014 | Chang ............... G01R 19/0084 327/143 |
| 9,407,254 B1 | 8/2016 | De et al. |
| 9,515,648 B2 * | 12/2016 | Chi ......................... G06F 1/24 |
| 10,637,462 B1 | 4/2020 | Pulipati et al. |
| 2017/0168841 A1 | 6/2017 | Ansari |

FOREIGN PATENT DOCUMENTS

WO 2020243626 A1 12/2020

* cited by examiner

*Primary Examiner* — Jeffery S Zweizig
(74) *Attorney, Agent, or Firm* — Patterson + Sheridan, LLP

(57) ABSTRACT

A power-on reset circuit with reduced detection time. One example power-on reset circuit generally includes a voltage sensing circuit having an input coupled to a first power supply rail; a variable resistance component having a control input coupled to an output of the voltage sensing circuit and having a first terminal coupled to the first power supply rail; and an amplitude detection circuit having a first input coupled to the first power supply rail and having a second input coupled to a second terminal of the variable resistance component, the amplitude detection circuit being configured to generate a power-on reset signal at an output of the amplitude detection circuit based on a difference between a first voltage of the first power supply rail and a second voltage at the second terminal of the variable resistance component.

20 Claims, 6 Drawing Sheets

POWER-ON RESET CIRCUIT WITH REDUCED DETECTION TIME

TECHNICAL FIELD

Examples of the present disclosure generally relate to electronic circuits and, more particularly, to a power-on reset (PoR) circuit.

BACKGROUND

Power-on reset (PoR) circuits are used to provide a predictable voltage during the initial application of power to a device. A PoR signal may be de-asserted when the supply voltage reaches and maintains a desired value, indicating to other components in an electrical device to enter a known operating state (e.g., a reset state). Some electronic devices have short power-ramp-up times. Accordingly, it may be desirable to sense the ramp-up rate of the device and minimize the delay time between completion of the power-ramp-up and signaling the other components to enter the known operating state. Additionally, some electronic devices may have power supplies with what are considered relatively high voltages (e.g., 1.8 V to 3.3 V). Accordingly, a PoR circuit that is capable of providing a PoR signal for such power supplies is desirable. Moreover, electronic devices are being manufactured with increasingly smaller areas, thereby creating a desire for increasingly smaller PoR circuitry.

SUMMARY

Examples of the present disclosure generally relate to a power-on reset (PoR) circuit with relatively low detection time.

One example of the present disclosure is a PoR circuit. The PoR circuit generally includes a voltage sensing circuit having an input coupled to a first power supply rail; a variable resistance component having a control input coupled to an output of the voltage sensing circuit and having a first terminal coupled to the first power supply rail; and an amplitude detection circuit having a first input coupled to the first power supply rail and having a second input coupled to a second terminal of the variable resistance component, the amplitude detection circuit being configured to generate a power-on reset signal at an output of the amplitude detection circuit based on a difference between a first voltage of the first power supply rail and a second voltage at the second terminal of the variable resistance component.

Another example of the present disclosure is a method for power-on reset. The method generally includes ramping up a power supply voltage; sensing the power supply voltage with a voltage sensing circuit to generate a sensed power supply voltage; generating a delayed voltage signal from the power supply voltage using a variable resistance component, wherein generating the delayed voltage signal comprises controlling the variable resistance component based on the sensed power supply voltage; and generating, using an amplitude detection circuit, a power-on reset signal based on a difference between the power supply voltage and the delayed voltage signal.

Yet another example of the present disclosure is an apparatus. The apparatus generally includes means for ramping up a power supply voltage; means for sensing the power supply voltage to generate a sensed power supply voltage; means for generating a delayed voltage signal from the power supply voltage, the means for generating the delayed voltage signal being configured to be controlled by the sensed power supply voltage from the means for sensing; and means for generating a power-on reset signal based on a difference between the power supply voltage and the delayed voltage signal.

Yet another example of the present disclosure is a programmable integrated circuit (IC). The programmable IC generally includes the power-on-reset circuit described herein and a plurality of configurable logic blocks (CLBs), wherein at least a portion of the plurality of configurable logic blocks is coupled to the output of the amplitude detection circuit.

These and other examples may be understood with reference to the following detailed description.

BRIEF DESCRIPTION OF DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of the scope of the claims.

To facilitate understanding, identical reference numerals have been used, where possible, to designate identical elements that are common to the figures. It is contemplated that elements of one example may be beneficially incorporated in other examples without specific recitation.

DETAILED DESCRIPTION

Figure 1:
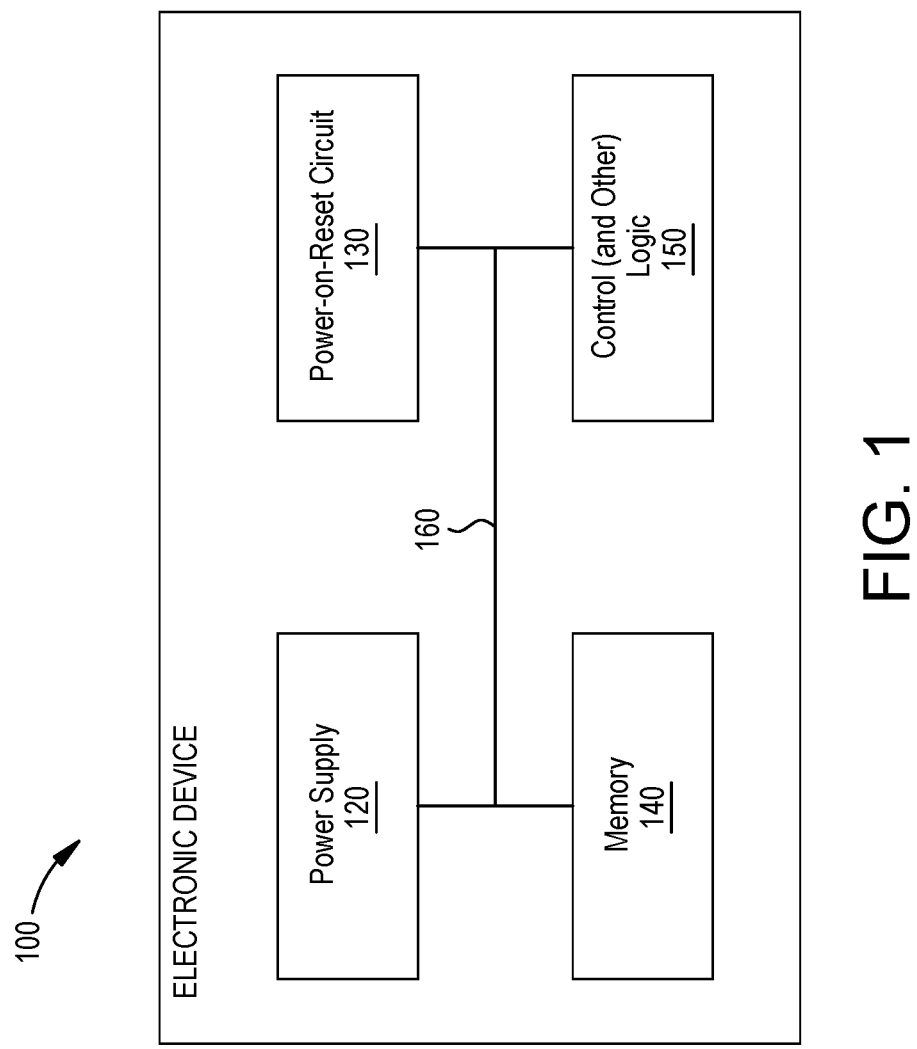
FIG. 1 is a block diagram of an example electronic device having a power-on reset (PoR) circuit, in which aspects of the present disclosure may be practiced.

Examples of the present disclosure generally relate to a power-on reset (PoR) circuit with an efficient boot-up time, such as for use in electronic devices with short power-ramp-up times. To achieve this efficient boot-up time, the PoR circuit may include an amplitude detection circuit to provide a PoR signal when the power supply voltage ramps up close to the final target level.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. The figures are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Example Electrical Device with a Power-on Reset Circuit

FIG. 1 is a block diagram of an example electronic device 100, in which aspects of the present disclosure may be practiced. The electronic device 100 may represent a consumer product (e.g., a smartphone) or an integrated circuit (e.g., a system on a chip (SoC)), for example. As shown, the electronic device 100 may include a power supply 120, a power-on reset (PoR) circuit 130, a memory component 140, and a control (and other) logic component 150. A bus 160 may be representative of various connections between the components of the electronic device 100, where these connections may be used to route power, control signals, and/or data signals between the components.

When the electronic device 100 powers on, the power supply 120 provides power to the PoR circuit 130. The PoR circuit 130 may include circuitry to detect that power is being supplied to an electronic device and generate a reset signal for one or more other components of the electronic device. In some examples, the PoR circuit 130 may output the reset signal to the control (and other) logic component 150 of the electronic device 100 and/or the memory component 140. In some examples, the control (and other) logic component 150 may signal other components of the electronic device 100 (such as the memory component 140) to enter a known operating state (e.g., a reset state).

Delay during boot-up of electronic devices has been a design concern for many years and will remain so as power-ramp-up speeds continue to increase for electronic devices. Accordingly, it may be desirable to sense the ramp-up rate of a device and minimize, or at least reduce, the delay time between completion of the power-ramp-up and signaling the components to enter the known operating state.

Example Power-On Reset Circuit Architecture

Figure 2:
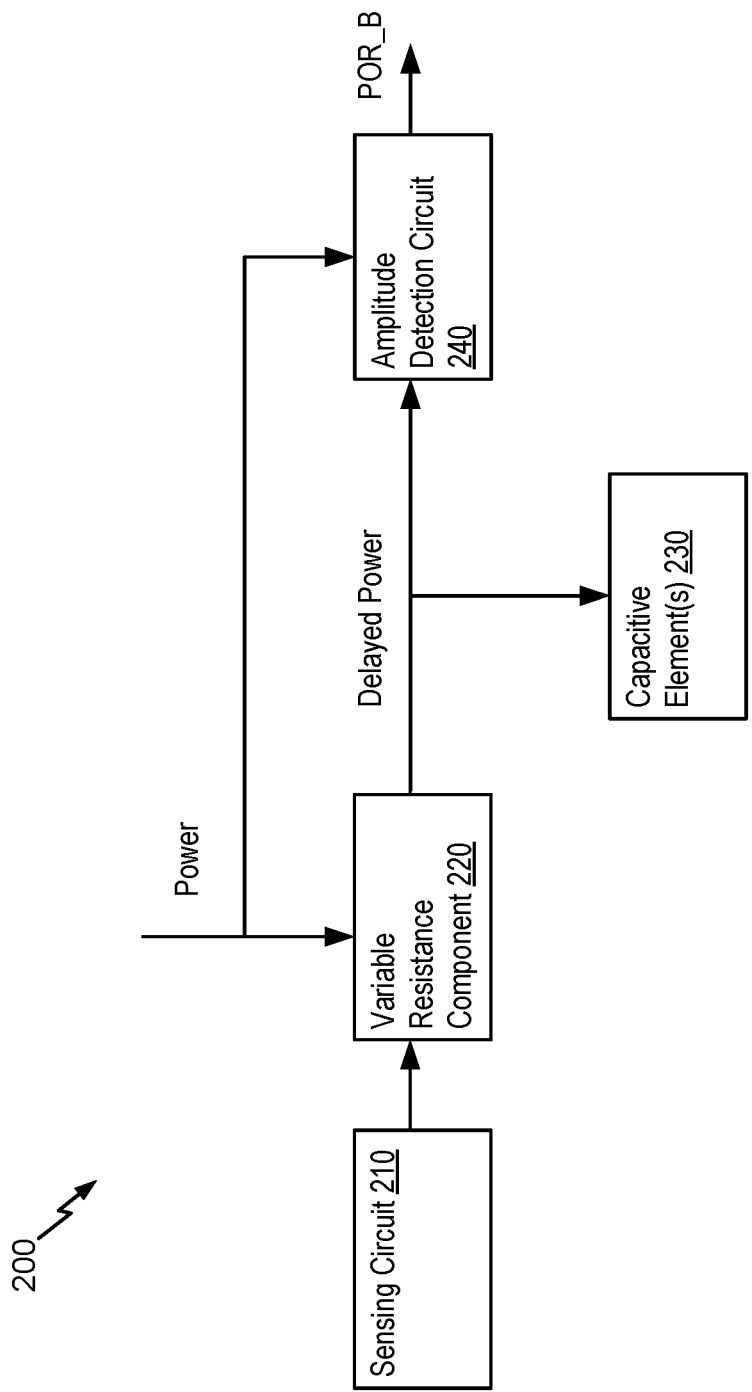
FIG. 2 is a block diagram of an example PoR circuit, according to certain aspects of the present disclosure.

FIG. 2 is a block diagram of an example power-on reset (PoR) circuit 200 configured to minimize, or at least reduce, delay time in electronic devices with short ramp-up times, according to certain aspects of the present disclosure. The PoR circuit 200 may be used as a PoR circuit (e.g., PoR circuit 130) in an electronic device (e.g., electronic device 100). As illustrated in FIG. 2, the PoR circuit 200 includes sensing circuit 210, a variable resistance component 220, one or more capacitive element(s) 230, and an amplitude detection circuit 240.

In some examples, the sensing circuit 210 may receive input voltage signals (e.g., internal detected power signals) from a detecting circuit (not shown in FIG. 2) and generate a control signal for the variable resistance component 220 based on the received input voltage signals. The sensing circuit 210 may take complementary input signals from the detecting circuit (as shown in FIGS. 3 and 4) to avoid potential glitches when the PoR signal is de-asserted.

The sensing circuit 210 may output a control signal (e.g., a bias voltage signal) to the variable resistance component 220. The control signal from the sensing circuit 210 controls the resistance of the variable resistance component 220 and may depend on the process, voltage, and tracking (PVT) of internal components (e.g., transistor(s) and resistive element (s)) of the sensing circuit, as described below.

Figure 3:
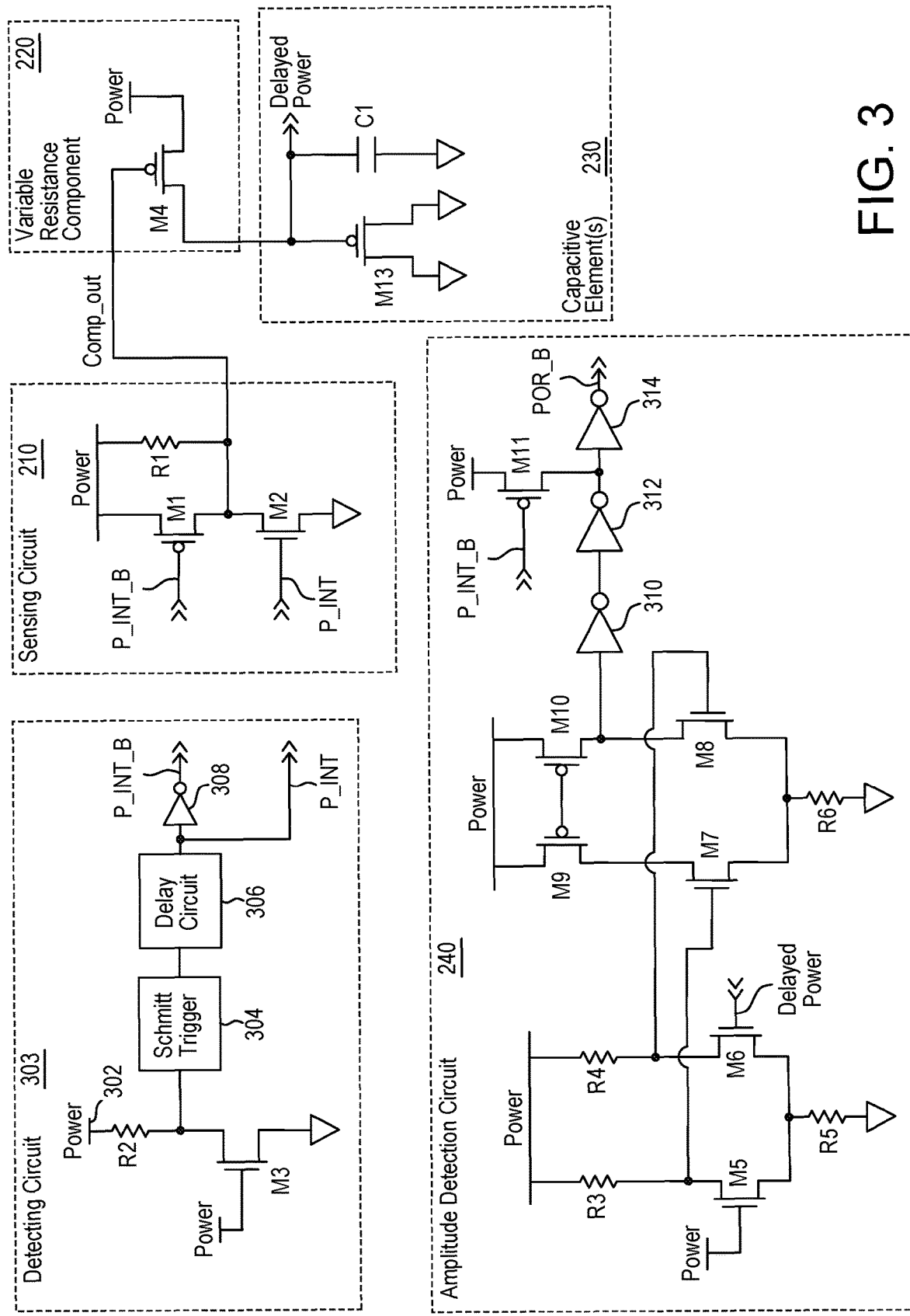
FIG. 3 is a schematic diagram illustrating an example PoR circuit for use in a device with a power supply voltage no greater than a transistor breakdown voltage, according to certain aspects of the present disclosure.
Figure 4:
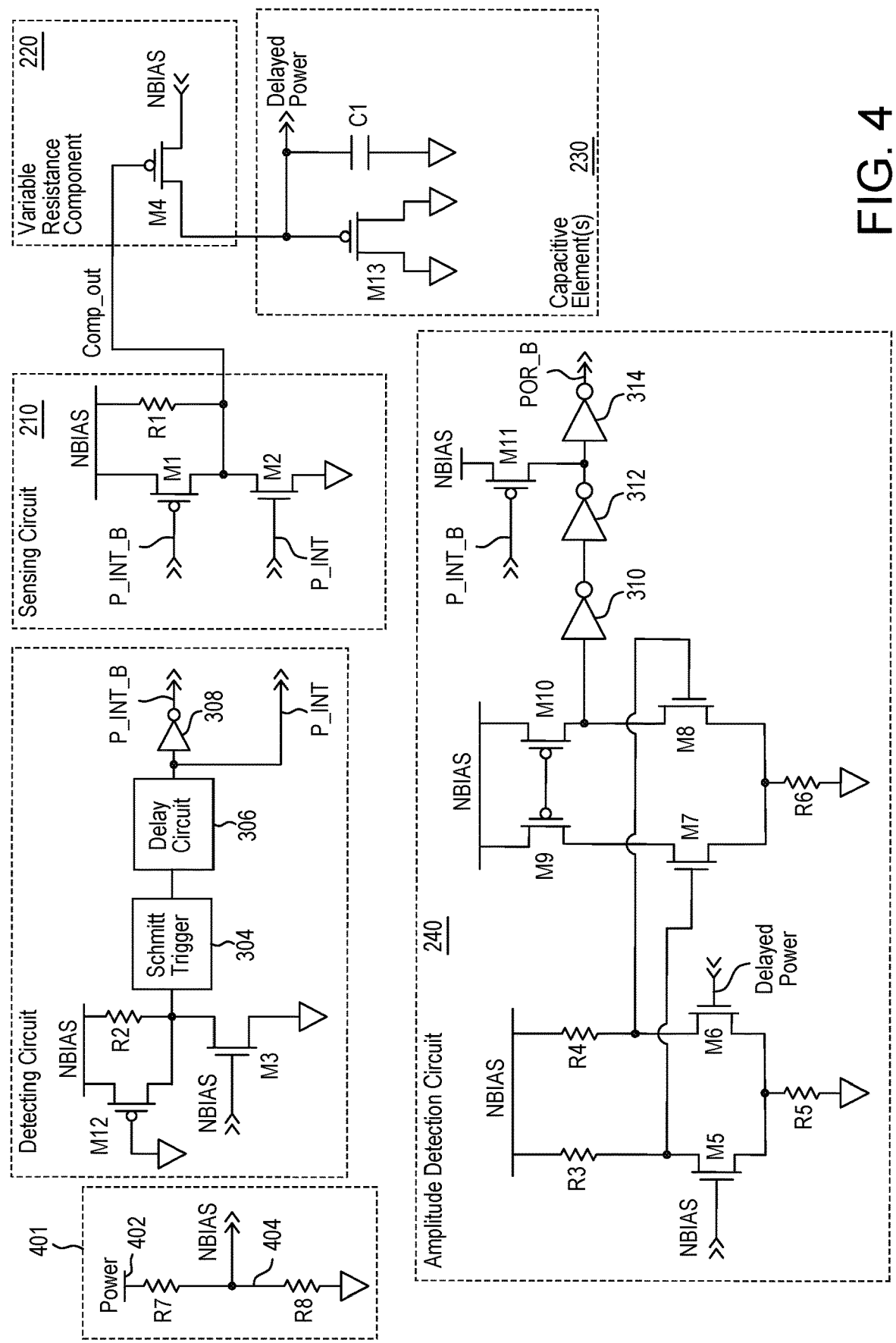
FIG. 4 is a schematic diagram illustrating an example PoR circuit for use in a device with a power supply voltage of more than the breakdown voltage, according to certain aspects of the present disclosure.

In some examples, the variable resistance component 220 may be implemented as a p-type transistor (e.g., a p-channel metal-oxide-semiconductor (PMOS) transistor), as shown in FIGS. 3 and 4. In this case, the sensing circuit 210 may output the bias voltage signal to a gate of the PMOS transistor. As shown in FIG. 2, the variable resistance component 220 may also receive an input labeled "Power" from a power supply rail. The PMOS transistor may be biased to work in a deep sub-threshold region (e.g., gate-source voltage of less than 200 mV), which causes the PMOS transistor to have high resistance (e.g., 100 MΩ). Thus, the sensing circuit 210 may generate the bias voltage signal to be close to the power supply voltage on the power supply rail. The variable resistance component 220 may output a signal (labeled "Delayed Power" in FIGS. 2-4) representing a delayed version of the power supply voltage "Power."

The sensing circuit 210 and the variable resistance component 220 may include transistors fabricated using the same semiconductor process. In this manner, the sensing circuit 210 is a PVT-tracking sensing circuit, where the output control signal may change with changes in the power supply voltage and/or in the ambient temperature. Furthermore, the variable resistance component 220 may function as a PVT-compensated variable resistance component, where the resistance may track PVT, as well. In this manner, the Delayed Power signal may track PVT, and thus, the PoR circuit 200 may better track PVT. The output of the sensing circuit 210 and the Delayed Power signal will ramp up along with the power supply ramp.

The output of the variable resistance component 220 may be coupled to one or more capacitive element(s) 230. The capacitive element(s) 230 may act as one or more shunt capacitors. The capacitive element(s) 230 may include a PMOS capacitor, which may use leakage to reduce the delay time at temperatures of at least 125 degrees Celsius. The capacitive element(s) 230 may also include a metal-oxide-metal (MOM) capacitor, which may be used to provide sufficient signal margin to the next stage of the PoR circuit (e.g., the amplitude detection circuit 240). The resistor-capacitor (RC) combination of the variable resistance component 220 and the capacitive element(s) 230 provides a delayed power supply signal (labeled "Delayed Power" in FIGS. 2-4) based on the input power supply voltage. Both the power supply voltage and the delayed power supply voltage are used as inputs to an amplitude detection circuit 240.

The amplitude detection circuit 240 may sense the difference of the voltage from the power supply rail (e.g., Power) and the voltage at the output of the variable resistance component 220 (i.e., Delayed Power). The amplitude detection circuit 240 may be implemented by any of various suitable circuits, such as a squelch detector. The amplitude detection circuit 240 may be configured to determine when the power supply rail reaches and maintains a desired voltage level. The amplitude detection circuit 240 may determine that the power supply rail has not reached the desired voltage level (e.g., is still ramping up) when the difference between the voltage from the power supply rail and the Delayed Power voltage is greater than a threshold value. The amplitude detection circuit 240 may be configured to change its output (e.g., from logic 0 to logic 1) when the power supply rail approaches the desired voltage level (e.g., when the difference Power and Delayed Power becomes less than the threshold value). The change (i.e., the logic state transition) in the output of the amplitude detection circuit 240 may signal to the other components of the electronic device (e.g., electronic device 100) to enter a known operating state (e.g., a reset state).

Example Power-on Reset Circuits with Reduced Detection Time

As described above, some examples of the present disclosure provide a power-on reset (PoR) circuit capable of quickly detecting that power is being supplied to an electronic device and, in response, generating a reset signal. The PoR circuit may then signal to the other components of the electronic device (e.g., electronic device 100) to enter a known operating state (e.g., a reset state).

FIG. 3 is a circuit diagram illustrating an example implementation of a PoR circuit 300, according to certain aspects of the present disclosure. The PoR circuit 300 may be used in an electronic device for a power supply having a power supply voltage of no more than a breakdown voltage (e.g., 1.8 volts) of transistors therein. A power supply rail 302 with the power supply voltage of interest for the power-on reset may supply power to the PoR circuit 300. The PoR circuit 300 may include a sensing circuit 210, a variable resistive component 220, one or more capacitive element(s) 230, and an amplitude detection circuit 240. The PoR circuit 300 may also include a detecting circuit 303 (also referred to as a "power detection circuit"), as shown in FIG. 3 and described above with respect to FIG. 2. The detecting circuit 303 may be considered to be part of the sensing circuit 210 or as a separate entity.

The detecting circuit 303 may include an n-type (e.g., an n-channel metal-oxide-semiconductor (NMOS)) transistor M3 and a resistive element R2 coupled in series between the power supply rail 302 and a reference potential node (e.g., electrical ground). The detecting circuit 303 may also include a Schmitt trigger 304 configured to sense the voltage at a node between transistor M3 and resistive element R2 and output a value based on whether the voltage is below or above a threshold value. The detecting circuit also includes a delay circuit 306 coupled to the output of the Schmitt trigger 304 and configured to delay the output signal of the Schmitt trigger 304 before the signal passes to an inverter 308. The input node of the inverter 308 (labeled "P_INT" in FIG. 3 for internal power signal) and the output node of the inverter 308 (labeled "P_INT_B" in FIG. 3 for complementary internal power signal) may be coupled to the input nodes of the sensing circuit 210.

The sensing circuit 210 includes a pull-up p-type (e.g., PMOS) transistor M1 and a pull-down n-type (e.g., NMOS)) transistor M2 coupled in series between the power supply rail 302 and the reference potential node. In some examples, transistor M1 is a strong transistor (e.g., has a relatively high transconductance), and M2 is a weak transistor (e.g., has a relatively low transconductance). The sensing circuit 210 may also include a resistive element R1 coupled in parallel with transistor M1. The P_INT node may be coupled to the gate of transistor M2 as a control input, and the P_INT_B node may be coupled as a control input to the gate of transistor M1. While Power is ramping up, the value of the P_INT node becomes logic 1, and the value of the P_INT_B node becomes logic 0.

The output of the sensing circuit 210 (labeled "Comp_out") is coupled to the variable resistance component 220, which may be implemented by a p-type transistor M4, as shown in FIG. 3. The gate of transistor M4 may be coupled to the output of the sensing circuit 210. The source of transistor M4 may be coupled to the power supply rail 302, and the drain of transistor M4 may be coupled to the one or more capacitive element(s) 230. The ratio of transistor M1 to transistor M2 may be selected such that the output voltage of the sensing circuit 210 (Comp_out) is nearly the same as the voltage of the power supply rail 302. P-type transistor M4 may be biased to work in a deep sub-threshold region (e.g., gate-source voltage of less than 200 mV), which causes this p-type transistor to have high resistance (e.g., 100 MΩ). The node between the drain of transistor M4 and the one or more capacitive element(s) 230 is referred to in FIG. 3 as "Delayed Power."

The one or more capacitive element(s) 230 may include a capacitive element C1 and a PMOS transistor M13 (functioning as a PMOS capacitor), coupled between the drain of transistor M4 and the reference potential node. For some examples, the gate of transistor M13 is coupled to the drain of M4, and the drain and source of transistor M13 are coupled to the reference potential node. Transistor M13 may provide some leakage to reduce the delay time generated at temperatures of at least 125 degrees Celsius. Capacitive element C1 may be a metal-oxide-metal (MOM) capacitor, which provides sufficient signal margin to the next stage of the PoR circuit (e.g., the amplitude detection circuit 240).

As shown in the example of FIG. 3, the amplitude detection circuit 240 includes resistive element R3 coupled between the power supply rail 302 and the drain of n-type transistor M5, and resistive element R4 coupled between the power supply rail 302 and the drain of n-type transistor M6. In some examples, the resistance value of R4 is greater than the resistance value of R3 so that the voltage at the drain of M5 is greater than the voltage at the drain of transistor M6 initially during power-ramp-up. The gate of transistor M5 is coupled to the power supply rail 302, and the gate of transistor M6 is coupled to Delayed Power (i.e., the node coupled to the drain of transistor M4 and the one or more capacitive element(s) 230). Additionally, a resistive element R5 may be coupled between the reference potential node and the sources of transistors M5 and M6, as shown.

The amplitude detection circuit 240 may also include an n-type transistor M7, a p-type transistor M9 coupled between the power supply rail 302 and the n-type transistor M7, an n-type transistor M8, and a p-type transistor M10 coupled between the power supply rail 302 and the n-type transistor M8. The gates of transistors M9 and M10 may be coupled together. The gate of transistor M7 may be coupled to the drain of transistor M5, and the gate of transistor M8 may be coupled to the drain of transistor M6.

The amplitude detection circuit 240 may also include a first inverter 310 having an input coupled to the drain of transistor M10 and the drain of transistor M8. The output of inverter 310 is coupled to the input of a second inverter 312, and the output of inverter 312 is coupled to the input of a third inverter 314. The output of inverter 312 may also be coupled to the drain of a p-type transistor M11. The source of transistor M11 may be coupled to the power supply rail 302, and the gate of transistor M11 may be coupled to the P_INT_B node. When present, transistor M11 may ensure that the output signal of the PoR circuit 300 (labeled "POR_B") does not glitch by indicating the PoR signal too early in the power-ramp-up process.

The output of the amplitude detection circuit 240 (POR_B) indicates when the other components of an electronic device (e.g., electronic device 100) should enter a known operating state (e.g., a reset state). The PoR circuit 300 is configured to output this indication when the power supply rail approaches a desired voltage level (e.g., the final target level). The POR_B signal may transition from a logic 0 to a logic 1 when this occurs, equivalent to de-asserting a typical PoR signal.

FIG. 4 is a circuit diagram illustrating an example implementation of a PoR circuit 400, according to certain aspects of the present disclosure. The PoR circuit 400 may be used in an electronic device with a power supply having a power supply voltage greater than the breakdown voltage of transistors therein (e.g., more than 1.8 V, such as 2.5 V or 3.3 V). The PoR circuit 400 is similar to the PoR circuit 300 of FIG. 3, but with some additional circuitry. For example, the PoR circuit 400 includes a voltage divider 401 to supply a bias voltage at a lower voltage than the power supply rail 402 (e.g., half the voltage). The voltage divider 401 may include resistive elements R7 and R8 coupled in series between the power supply rail 402 and a reference potential node (e.g., electrical ground for the PoR circuit 400). The PoR circuit 400 then uses a tap 404 (labeled "NBIAS" in FIG. 4) of the voltage divider 401 as the power supply rail (as opposed to the power supply rail 302 in FIG. 3) for the other components of the PoR circuit. For some examples, resistive element R7 may have the same resistance value as resistive element R8.

For some examples, the PoR circuit 400 may also include a p-type transistor M12 in the detecting circuit 303. As shown in FIG. 4, transistor M12 is coupled in parallel with resistive element R2, with the gate of transistor M12 being coupled to the reference potential node. Transistor M12 may be added to ensure that the voltage provided to the Schmitt trigger 304 is well controlled when the power supply rail 402 has a voltage between 1.2 V and 3.3 V, for example.

Example Power-on Reset Operations

Figure 5:
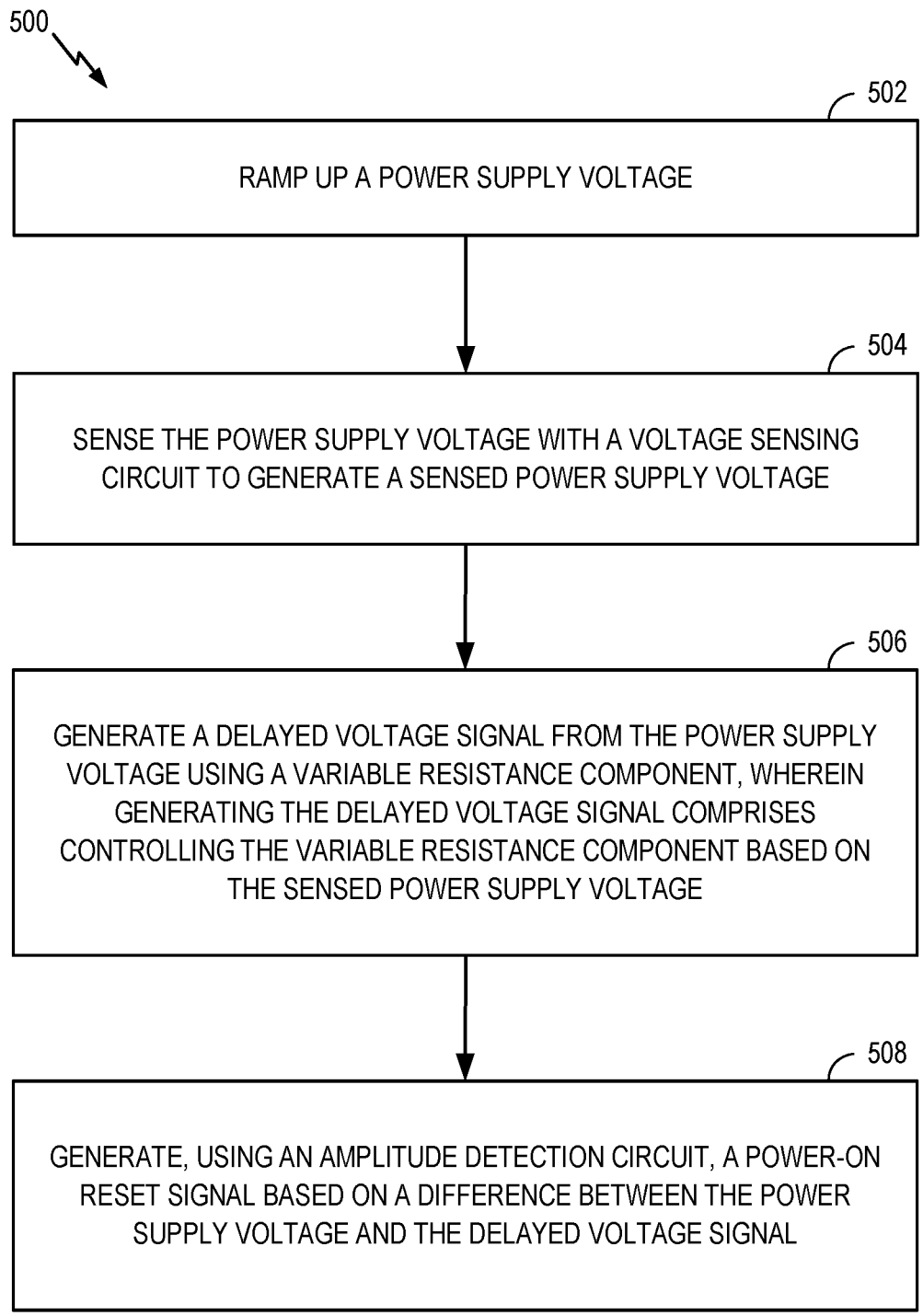
FIG. 5 is a flow diagram of example operations for generating a power-on reset signal in response to an initial application of power to a device, according to certain aspects of the present disclosure.

FIG. 5 is a flow diagram of example operations 500 for generating a power-on reset signal in response to an initial application of power to a device, according to certain aspects of the present disclosure. The operations 500 may be performed by a power-on reset (PoR) circuit (e.g., the PoR circuit 200, 300, or 400).

The operations 500 may begin, at block 502, by ramping up a power supply voltage (e.g., with a power supply, such as power supply 120). At block 504, the power-on reset circuit may sense the power supply voltage with a voltage sensing circuit (e.g., the voltage sensing circuit 210) to generate a sensed power supply voltage. At block 506, the power-on reset circuit may generate a delayed voltage signal from the power supply voltage using a variable resistance component (e.g., the variable resistance component 220). In this example, generating the delayed voltage signal may include controlling the variable resistance component based on the sensed power supply voltage. At block 508, the power-on reset circuit may generate, using an amplitude detection circuit (e.g., the amplitude detection circuit 240), a power-on reset signal based on a difference between the power supply voltage and the delayed voltage signal.

According to some examples, the operations 500 may further involve voltage dividing (e.g., with the voltage divider 401) another power supply voltage to generate the power supply voltage.

According to some examples, the variable resistance component comprises a transistor (e.g., transistor M4). In this case, controlling the variable resistance component may involve biasing the transistor in a sub-threshold region. For some examples, generating the delayed voltage signal may further involve using a shunt capacitive element. For some examples, the shunt capacitive element may include a p-channel metal-oxide-semiconductor (PMOS) transistor (e.g., PMOS transistor M13) and a metal-oxide-metal (MOM) capacitor (e.g., MOM capacitor C1). For some examples, the shunt capacitive element may be biased to provide a PVT-compensated capacitance, which may further improve the sensing time.

According to some examples, the operations 500 may further involve generating complementary control signals (e.g., P_INT and P_INT_B) for controlling the voltage sensing circuit based on the power supply voltage. For some examples, the complementary control signals may transition (i.e., change logic states) after the power supply voltage ramps up above a threshold.

For some examples, the sensed voltage and/or a resistance of the variable resistance component may track process, voltage, and temperature (PVT).

Example Programmable Integrated Circuits

The power-on reset (PoR) circuits described herein may be implemented in the PoR system of an electrical device, for example. A PoR system (e.g., PoR circuits 300 or 400) may be included in any of various suitable devices or systems, such as an integrated circuit (IC) or module.

One type of IC that may utilize a PoR circuit (e.g., PoR circuits 300 or 400) is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs known as "mask programmable devices" are programmed by applying a processing layer, such as a metal layer, that selectively interconnects the various elements on the device according to the programmable mask. The phrase "programmable IC" can also encompass devices that are only partially programmable, such as application-specific integrated circuits (ASICs).

Figure 6:
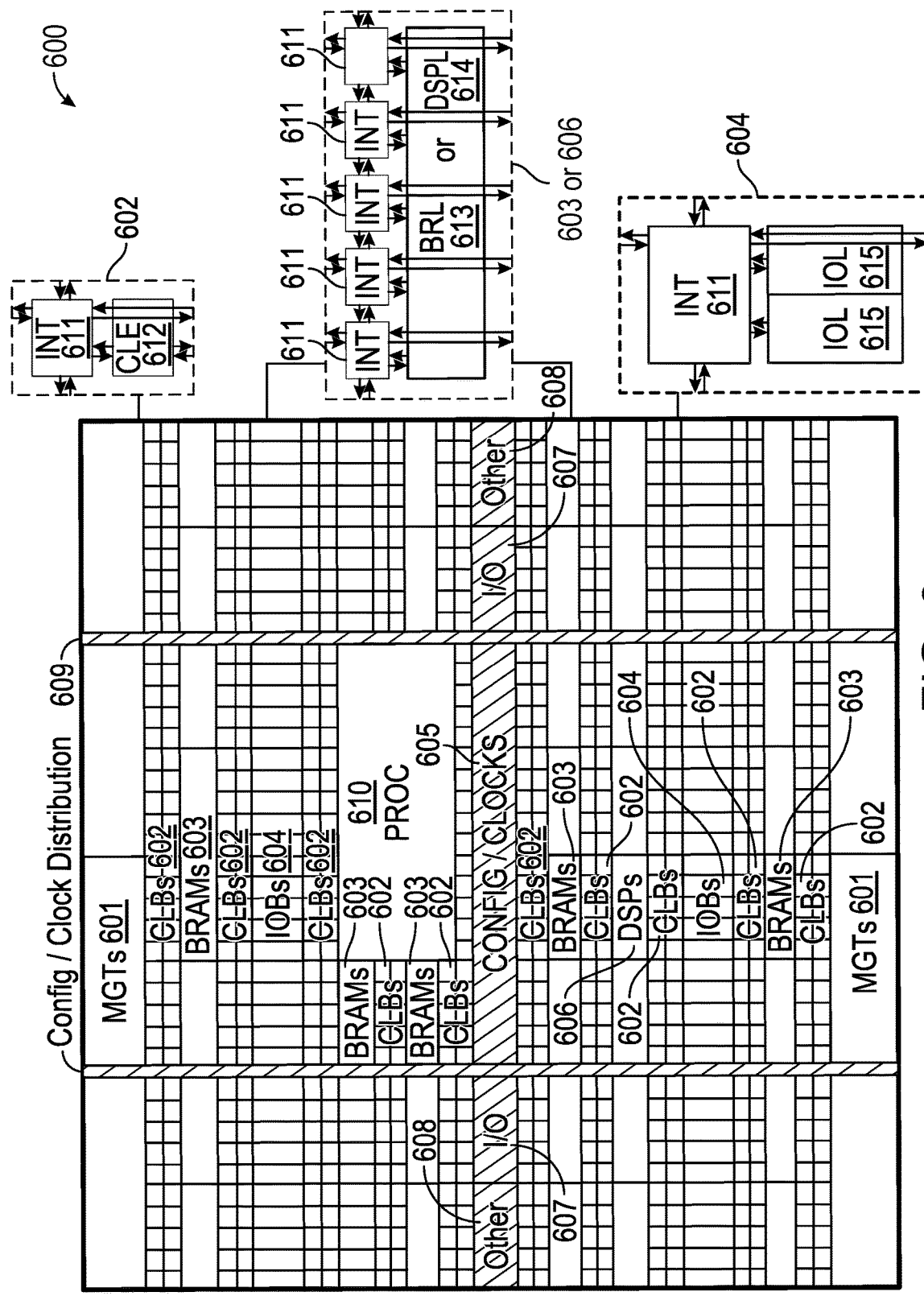
FIG. 6 is a block diagram illustrating an example architecture for a programmable device, in which aspects of the present disclosure may be practiced.

FIG. 6 is a block diagram illustrating an example architecture 600 for a programmable device. The architecture 600 may be implemented within a field programmable gate array (FPGA), for example. As shown, the architecture 600 includes several different types of programmable circuitry (e.g., logic blocks). For example, the architecture 600 may include a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing (DSP) blocks 606, specialized I/O blocks 607 (e.g., configuration ports and clock ports), and other programmable logic 608, such as digital clock managers, analog-to-digital converters (ADCs), system monitoring logic, and the like.

In some FPGAs, each programmable tile includes a programmable interconnect element (INT) 611 having standardized connections to and from a corresponding INT 611 in each adjacent tile. Therefore, the INTs 611, taken together, implement the programmable interconnect structure for the illustrated FPGA. Each INT 611 also includes the connections to and from the programmable logic element within the same tile, as shown by the examples included at the far right of FIG. 6.

For example, a CLB 602 may include a configurable logic element (CLE) 612 that can be programmed to implement user logic plus a single INT 611. A BRAM 603 may include a BRAM logic element (BRL) 613 in addition to one or more INTs 611. Typically, the number of INTs 611 included in a tile depends on the width of the tile. In the pictured example, a BRAM tile has the same width as five CLBs, but other numbers (e.g., four) can also be used. A DSP block 606 may include a DSP logic element (DSPL) 614 in addition to an appropriate number of INTs 611. An IOB 604 may include, for example, two instances of an I/O logic element (IOL) 615 in addition to one instance of an INT 611. As will be clear to a person having ordinary skill in the art, the actual I/O pads connected, for example, to the IOL 615 typically are not confined to the area of the IOL 615.

In the example architecture 600 depicted in FIG. 6, a horizontal area near the center of the die (shown shaded in FIG. 6) is used for configuration, clock, and other control logic (CONFIG/CLOCKS 605). Other vertical areas 609 extending from this central area may be used to distribute the clocks and configuration signals across the breadth of the FPGA.

Some FPGAs utilizing the architecture 600 illustrated in FIG. 6 include additional logic blocks that disrupt the regular row structure making up a large part of the FPGA. The additional logic blocks may be programmable blocks and/or dedicated circuitry. For example, a processor block depicted as PROC 610 spans several rows of CLBs 602 and BRAMs 603.

The PROC 610 may be implemented as a hard-wired processor that is fabricated as part of the die that implements the programmable circuitry of the FPGA. The PROC 610 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 610 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein), as well as to the interconnect circuitry that selectively couples the various circuit blocks, tiles, and/or elements according to configuration data that is loaded into the FPGA. For example, portions shown in FIG. 6 that are external to the PROC 610 may be considered part of the, or the, programmable circuitry of the FPGA.

FIG. 6 is intended to illustrate an example architecture 600 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 6 are exemplary. In an actual FPGA, for example, more than one adjacent row of CLBs 602 is typically included wherever the CLBs appear, in an effort to facilitate the efficient implementation of a user circuit design. The number of adjacent CLB rows, however, can vary with the overall size of the FPGA. Further, the size and/or positioning of the PROC 610 within the FPGA is for purposes of illustration only and is not intended as a limitation of the one or more examples of the present disclosure.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The various processes in methods described above may be performed by any suitable means capable of performing the corresponding process functions. Such means may include various hardware and/or software component(s) and/or module(s), including, but not limited to a circuit, a field-programmable gate array (FPGA) or other programmable logic, an application-specific integrated circuit (ASIC), or a processor. Generally, where there are operations illustrated in figures, those operations may have corresponding counterpart means-plus-function components with similar numbering.

As an example, means for ramping up a power supply voltage may include a power supply (e.g., the power supply 120, such as a switched-mode power supply, or a battery). Means for sensing the power supply voltage to generate a sensed power supply voltage may include a voltage sensing circuit (e.g., the sensing circuit 210). Means for generating a delayed voltage signal from the power supply voltage may include delay circuitry (e.g., the variable resistance component 220). According to some examples, the means for generating the delayed voltage signal may be configured to be controlled by the sensed power supply voltage from the means for sensing (e.g., the sensing circuit 210). Means for generating a power-on reset signal based on a difference between the power supply voltage and the delayed voltage signal may include an amplitude detection circuit (e.g., the amplitude detection circuit 240), such as a squelch detector.

In the preceding, reference is made to aspects presented in this disclosure. However, the scope of the present disclosure is not limited to specific described aspects. Instead, any combination of the described features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim. In other words, other and further examples may be devised without departing from the basic scope of the present disclosure, and the scope thereof is determined by the claims that follow.

The invention claimed is:

1. A power-on reset circuit comprising:
 a voltage sensing circuit having an input coupled to a first power supply rail;

a variable resistance component having a control input coupled to an output of the voltage sensing circuit and having a first terminal coupled to the first power supply rail; and an amplitude detection circuit having a first input coupled to the first power supply rail and having a second input coupled to a second terminal of the variable resistance component, the amplitude detection circuit being configured to generate a power-on reset signal at an output of the amplitude detection circuit based on a difference between a first voltage of the first power supply rail and a second voltage at the second terminal of the variable resistance component.

2. The power-on reset circuit of claim 1, further comprising:
  a p-channel metal-oxide-semiconductor (PMOS) capacitor coupled between the second terminal of the variable resistance component and a reference potential node; and
  a capacitive element coupled between the second terminal of the variable resistance component and the reference potential node.

3. The power-on reset circuit of claim 2, wherein the capacitive element comprises a metal-oxide-metal (MOM) capacitor.

4. The power-on reset circuit of claim 1, wherein:
the voltage sensing circuit comprises:
  a first p-type transistor having a source coupled to the first power supply rail;
  a first n-type transistor having a drain coupled to a drain of the first p-type transistor and having a source coupled to a reference potential node; and
  a resistive element coupled between the drain of the first p-type transistor and the first power supply rail;
the drain of the first p-type transistor and the drain of the first n-type transistor are coupled to the output of the voltage sensing circuit; and
the variable resistance component comprises a second p-type transistor having a source coupled to the first terminal of the variable resistance component, having a gate coupled to the output of the voltage sensing circuit, and having a drain coupled to the second terminal of the variable resistance component.

5. The power-on reset circuit of claim 4, wherein the voltage sensing circuit further comprises a power detection circuit having an input coupled to the first power supply rail, having a first output coupled to a gate of the first n-type transistor, and having a second output coupled to a gate of the first p-type transistor.

6. The power-on reset circuit of claim 5, wherein the power detection circuit comprises:
  a second n-type transistor having a source coupled to the reference potential node;
  a second resistive element coupled between a drain of the second n-type transistor and the first power supply rail;
  a Schmitt trigger having an input coupled to the drain of the second n-type transistor;
  a delay circuit having an input coupled to an output of the Schmitt trigger; and
  an inverter having an input coupled to an output of the delay circuit, wherein:
    the output of the delay circuit is coupled to the first output of the power detection circuit; and
    an output of the inverter is coupled to the second output of the power detection circuit.

7. The power-on reset circuit of claim 1, wherein the amplitude detection circuit comprises:
  a first n-type transistor having a gate coupled to the first power supply rail;
  a second n-type transistor having a source coupled to a source of the first n-type transistor and a having a gate coupled to the second terminal of the variable resistance component;
  a first resistive element coupled between the first power supply rail and a drain of the first n-type transistor; and
  a second resistive element coupled between the first power supply rail and a drain of the second n-type transistor, wherein the second resistive element has a greater resistance than the first resistive element.

8. The power-on reset circuit of claim 7, wherein the amplitude detection circuit further comprises:
  a third n-type transistor having a gate coupled to the drain of the first n-type transistor;
  a fourth n-type transistor having a gate coupled to the drain of the second n-type transistor;
  a first p-type transistor having a source coupled to the first power supply rail and having a drain coupled to a drain of the third n-type transistor;
  a second p-type transistor having a source coupled to the first power supply rail, having a drain coupled to a drain of the fourth n-type transistor, and having a gate coupled to a gate of the first p-type transistor;
  a first inverter having an input coupled to the drain of the fourth n-type transistor and the drain of the second p-type transistor;
  a second inverter having an input coupled to an output of the first inverter; and
  a third inverter having an input coupled to an output of the second inverter and having an output coupled to the output of the amplitude detection circuit.

9. The power-on reset circuit of claim 8, wherein:
the voltage sensing circuit comprises:
  a third p-type transistor having a source coupled to the first power supply rail;
  a fifth n-type transistor having a drain coupled to a drain of the third p-type transistor and having a source coupled to a reference potential node; and
  a third resistive element coupled between the drain of the third p-type transistor and the first power supply rail;
a power detection circuit having an input coupled to the first power supply rail, having a first output coupled to a gate of the fifth n-type transistor, and having a second output coupled to a gate of the third p-type transistor; and
the amplitude detection circuit further comprises a fourth p-type transistor having a source coupled to the first power supply rail, having a drain coupled to the output of the second inverter, and having a gate coupled to the second output of the power detection circuit.

10. The power-on reset circuit of claim 1, further comprising a voltage divider having a tap coupled to the first power supply rail, having a first terminal coupled to a second power supply rail, and having a second terminal coupled to a reference potential node for the power-on reset circuit.

11. The power-on reset circuit of claim 10, wherein the voltage sensing circuit comprises:
  a p-type transistor having a source coupled to the first power supply rail and having a gate coupled to the reference potential node;
  an n-type transistor having a gate coupled to the first power supply rail, having a drain coupled to a drain of the p-type transistor, and having a source coupled to the reference potential node; and a resistive element coupled between the drain of the p-type transistor and the first power supply rail.

12. The power-on reset circuit of claim 1, wherein the amplitude detection circuit comprises a squelch detector.

13. The power-on reset circuit of claim 1, wherein the voltage sensing circuit comprises a process, voltage, and temperature (PVT)-tracking sensing circuit.

14. A programmable integrated circuit comprising:
a plurality of configurable logic blocks; and
a power-on reset circuit comprising:
   a voltage sensing circuit having an input coupled to a power supply rail;
   a variable resistance component having a control input coupled to an output of the voltage sensing circuit and having a first terminal coupled to the power supply rail; and
   an amplitude detection circuit having a first input coupled to the power supply rail and having a second input coupled to a second terminal of the variable resistance component, the amplitude detection circuit being configured to generate a power-on reset signal at an output of the amplitude detection circuit based on a difference between a first voltage of the power supply rail and a second voltage at the second terminal of the variable resistance component, wherein at least a portion of the plurality of configurable logic blocks is coupled to the output of the amplitude detection circuit.

15. The programmable integrated circuit of claim 14, wherein the at least the portion of the plurality of configurable logic blocks is configured to enter a reset state in response to reception of the power-on reset signal from the output of the amplitude detection circuit.

16. A method for power-on reset, comprising:
ramping up a power supply voltage;
sensing the power supply voltage with a voltage sensing circuit to generate a sensed power supply voltage;
generating a delayed voltage signal from the power supply voltage using a variable resistance component, wherein generating the delayed voltage signal comprises controlling the variable resistance component based on the sensed power supply voltage; and
generating, using an amplitude detection circuit, a power-on reset signal based on a difference between the power supply voltage and the delayed voltage signal.

17. The method of claim 16, further comprising voltage dividing another power supply voltage to generate the power supply voltage.

18. The method of claim 16, wherein the variable resistance component comprises a transistor, wherein controlling the variable resistance component comprises biasing the transistor in a sub-threshold region, and wherein generating the delayed voltage signal further comprises using a shunt capacitive element comprising a p-channel metal-oxide-semiconductor (PMOS) transistor and a metal-oxide-metal (MOM) capacitor.

19. The method of claim 16, further comprising generating complementary control signals for controlling the voltage sensing circuit based on the power supply voltage, wherein the complementary control signals transition after the power supply voltage ramps up above a threshold.

20. The method of claim 16, wherein the sensed voltage and a resistance of the variable resistance component track process, voltage, and temperature (PVT).

* * * * *